(12) United States Patent
Cavallo et al.

(10) Patent No.: US 12,720,905 B2
(45) Date of Patent: Aug. 25, 2026

(54) BENDABLE MATERIALS FOR ELECTROMAGNETIC INTERFERENCE SHIELDING AND DETECTION OF INFRARED AND VISIBLE RADIATION

(71) Applicant: UNM Rainforest Innovations, Albuquerque, NM (US)

(72) Inventors: Francesca Cavallo, Albuquerque, NM (US); Emma Renteria, Albuquerque, NM (US)

(73) Assignee: UNM Rainforest Innovations, Albuquerque, NM (US)

( * ) Notice: Subject to any disclaimer, the term of this patent is extended or adjusted under 35 U.S.C. 154(b) by 485 days.

(21) Appl. No.: 18/362,865

(22) Filed: Jul. 31, 2023

(65) Prior Publication Data

US 2024/0038906 A1 Feb. 1, 2024

Related U.S. Application Data

(60) Provisional application No. 63/393,791, filed on Jul. 29, 2022.

(51) Int. Cl.
*H10F 77/30* (2025.01)
*H10F 71/00* (2025.01)
(Continued)

(52) U.S. Cl.
CPC ......... *H10F 77/30* (2025.01); *H10F 71/1395* (2025.01); *H10F 77/334* (2025.01); *H10F 77/12* (2025.01); *H10F 77/14* (2025.01)

(58) Field of Classification Search
CPC ........ H10F 77/30; H10F 77/334; H10F 77/12; H10F 77/14; H10F 77/16; H10F 77/1698;
(Continued)

(56) References Cited

U.S. PATENT DOCUMENTS 4,939,043 A 7/1990 Biricik et al.
5,173,443 A * 12/1992 Biricik .................... G02B 1/10 148/DIG. 80

(Continued)

OTHER PUBLICATIONS

P Sahatiya et al "Graphene-based wearable temperature sensor and infrared photodetector on a flexible polyimide substrate" 2016 Flex. Print. Electron. 1 025006 (Year: 2016).*

(Continued)

*Primary Examiner* — Sitaramarao S Yechuri
(74) *Attorney, Agent, or Firm* — Keith A. Vogt; Keith Vogt, Ltd.

(57) ABSTRACT

The disclosed methods integrate EMI shielding with visible-to-IR or IR photodetection functionalities in flexible semiconductor/2D material devices, including photodiodes and photoconductive detectors. The processes generally involve transferring a 2D material onto a semiconductor membrane, depositing dielectric layers for electrical isolation and material protection, patterning windows and electrodes using photolithography and etching techniques, and forming top and bottom electrical contacts through metal deposition and lift-off processes. Additional steps include fabricating contact pads on a flexible receiving substrate, bonding the multifunctional material stack to the substrate, and releasing the structure through selective wet or dry etching of a sacrificial layer. The released device is then transferred, often via deionized water, and adhered to the flexible substrate, producing a mechanically flexible, multifunctional nanosheet capable of both electromagnetic interference shielding and infrared or broadband photodetection.

7 Claims, 7 Drawing Sheets

(51) Int. Cl.
*H10F 77/12* (2025.01)
*H10F 77/14* (2025.01)

(58) Field of Classification Search
CPC ... H10F 77/331; H10F 71/1395; H10F 71/139
See application file for complete search history.

(56) References Cited

U.S. PATENT DOCUMENTS

| | | | | |
|---|---|---|---|---|
| 6,160,661 | A | 12/2000 | Klocek et al. | |
| 9,704,964 | B1 * | 7/2017 | Ordonez | H10D 30/6741 |
| 2010/0140673 | A1 * | 6/2010 | Daniel | H05K 1/0221 257/288 |
| 2014/0361428 | A1 * | 12/2014 | Park | H01L 23/552 257/737 |
| 2021/0035917 | A1 * | 2/2021 | Fay | H01L 23/552 |
| 2021/0384159 | A1 * | 12/2021 | Ko | H01L 25/18 |
| 2022/0022350 | A1 * | 1/2022 | Eisaman | B32B 27/36 |
| 2022/0046836 | A1 * | 2/2022 | Guo | H05K 9/0094 |

OTHER PUBLICATIONS

Hou C, Multilayer Black Phosphorus Near-Infrared Photodetectors. Sensors (Basel). May 23, 2018;18(6):1668. doi: 10.3390/s18061668. PMID: 29789505; PMCID: PMC6022051. (Year: 2018).*

* cited by examiner

Single-Layer Shield

Multi-Layer Shield

Optical Transparency

(c) Transfer of 2D Material onto semiconductor membrane to from heterojunction (d) Deposition and definition of dielectric material (e) Metallization and definition of bottom electrodes (g) Bond semiconductor membrane to flexible substrate (h) Detach semiconductor membrane from growth substrate by etching sacrificial layer

BENDABLE MATERIALS FOR ELECTROMAGNETIC INTERFERENCE SHIELDING AND DETECTION OF INFRARED AND VISIBLE RADIATION

RELATED APPLICATIONS

This application claims priority to U.S. Provisional Application No. 63/393,791, filed on Jul. 29, 2022, which is incorporated herein in its entirety.

STATEMENT REGARDING FEDERALLY SPONSORED RESEARCH & DEVELOPMENT

Not applicable.

INCORPORATION BY REFERENCE OF MATERIAL SUBMITTED ON A COMPACT DISC

Not applicable.

BACKGROUND OF THE INVENTION

Metal grids provide excellent shielding effectiveness (SE) via reflection of incident electromagnetic radiation. For metal grids, the trade-off is low optical transparency through the geometric blockage, scattering, and undesired reflection of light Grids are also difficult to fabricate on curved surfaces, have low bending durability, and are susceptible to erosion damage by rain and particle impact Transparent conductive oxides (TCOs), in particular Indium Tin Oxide (ITO), are also widely employed for electromagnetic interference (EMI) shielding due to their optical transparency in the visible range and a SE>40 dB. However, TCOs are brittle; they have reduced transparency in the IR range, and, in some cases, they are in limited supply due to a shortage of their constitutive metals on Earth's crust.

Indeed, the scarcity of In is currently limiting the supply of ITO, which is widely used in many applications beyond EMI shielding. 2D materials, such as graphene, have excellent bendability and bending durability but exhibit a trade-off condition between shielding effectiveness of radio waves and IR transparency. For example, monolayer graphene is optically transparent but can only achieve a SE of 2.27 dB. On the other hand, multi-layer graphene exhibits a SE as high as 55 dB at 18 GHz at the cost of a lower transmittance of visible and IR radiation. MXenes have recently emerged as promising materials for EMI shielding via both reflection and absorption of radio waves. A 45 m-thick $Ti_3C_2T_x$ film exhibits a SE of 92 dB between 8.2 and 12.4 GHz. However, this material also has a trade-off between shielding performance and transparency. The optical transmittance of a $Ti_3C_2T_x$ film in the visible range drops from 91.2% to 43.8% as the thickness increases from 5 nm to 70 nm. As the thickness is reduced, the SE decreases significantly (i.e., for a 1.5 μm film, the SE is ~45 dB). An additional drawback of MXenes in the context of using them for EMI shielding is the lack of available synthesis techniques to fabricate large-area coatings. The most successful material to achieve high shielding effectiveness (60 dB) and high optical transparency in the visible range (90%) is a 13 nm thin layer of silver sandwiched between oxides. A significant drawback of this structure is the poor reproducibility and control in the deposition of ultra-thin metal films over large areas.

SUMMARY OF THE INVENTION

In one embodiment, the present invention concerns single-crystalline semiconductor membranes that satisfy all the requirements for a flexible and visible-to-IR transparent EMI shield.

In another embodiment, the present invention concerns heavily doped semiconductor membranes that achieve comparable electrical conductivities to TCOs and MXenes, thus effectively reflecting electromagnetic waves in the radiofrequency (RF) range.

In another embodiment, the present invention concerns single-crystalline semiconductor membranes that, because of their extreme aspect ratios, the semiconductor membranes exhibit exceptional mechanical flexibility (like soft polymeric materials) while retaining the superior reliability and electronic/optical properties of single-crystalline semiconductors.

In another embodiment, the present invention concerns single-crystalline semiconductor membranes that can serve as front-end, lightweight, and bendable EMI shields while allowing the integration of 2D materials to form a semiconductor/2D material heterojunction photodiode or a 2D material homojunction photodiode or a 2D material photoconductive detector on the back surface of the membranes.

In another embodiment, the present invention pertains to integrating photodetectors of visible to infrared (IR) wavelengths with EMI shields that operate in relevant frequency bands to current and future communication systems.

In another embodiment, the present invention concerns a device that uses a single-crystalline semiconductor membrane as an EMI shield and a 2D material-based photodetector of visible and/or IR electromagnetic radiation.

In another embodiment, the present invention concerns a single-crystalline semiconductor membrane that reduce the disruption or even failure in the operation of visible and IR sensors as increasingly electrified vehicles, a growing number of communications towers and the wide deployment of portable and wearable electronic devices saturate the electromagnetic operational environment (EMOE) with electromagnetic waves.

In another embodiment, the present invention concerns a layered material comprising: a flexible substrate which may be a Kapton film; subsequent layers include two electrodes, a dielectric, a two-dimensional material, and one or more semiconductor membranes.

In another embodiment, the present invention concerns a layered material wherein the semiconductor membrane blocks incident waves at radio frequencies (RF) while detecting infrared and visible radiation.

In another embodiment, the present invention concerns a layered material wherein the material comprises a uniformly and degenerately doped single-crystalline semiconductor membrane with a thickness ranging from 1 to 3 μm that serves as an IR transparent shield of RF waves with frequencies ranging between the X and the W band of the electromagnetic spectrum.

In another embodiment, the present invention concerns a layered material which integrates a single-crystalline semiconductor membrane with non-uniform doping across its thickness that serves as an optically transparent shield of RF waves with frequencies ranging between the X and the W band of the electromagnetic spectrum.

In another embodiment, the present invention concerns a semiconductor membrane having a thickness ranging between 100 and 300 nm and comprises one or two degenerately doped regions at the surface boundary of the membrane. Membranes with these thicknesses will be transparent to the visible and infrared part of the spectrum while the membranes thicker than 1 micron will only be transparent to the infrared part of the spectrum. The embodiments of the present invention provide superior performance as compared to existing technologies in that:

It integrates an EMI shield with a photodetector of visible and/or IR radiation.

The EMI shield is made of a single-crystalline semiconductor membrane, which exhibits high bending durability, and is less susceptible to erosion damage by rain and particle impact.

The EMI shield is transparent to both the visible and the infrared spectrum.

The EMI shield can effectively block EMI at frequencies ranging from the X to the W band.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

FIG. 1A shows the theoretically predicted shielding effectiveness and FIG. 1B shows the experimentally determined shielding effectiveness for such membrane. Second, a multi-layer shield consisting of two conductive 1 μm thick membranes with a 125 μm thick dielectric in the middle with FIG. 1C showing the theoretically predicted shielding effectiveness and FIG. 1D showing the experimentally determined shielding effectiveness for such multi-layer shield. The curve designated as (SE), shows the total shielding effectiveness the (R) curve shows the shielding effectiveness by reflection, the (A) curve shows shielding effectiveness by absorption and the (B) shows shielding effectiveness by multiple internal reflections.

FIG. 2A depicts optical transmittance versus wavelength for GaAs membranes with different thickness and FIG. 2B shows optical transmittance versus wavelength for a 1 μm thick GaAs membrane with and without antireflective coating.

FIGS. 4A, 413, 4C, 4D, 4E, 4F, 4G and 4H depict a sample structure upon selected steps of the fabrication process to realize the proposed 2D material/semiconductor photodiode with the integrated EMI shield.

DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

In one preferred embodiment, the present invention provides an ultra-thin multi-functional material that blocks incident waves at radio frequencies (RF) while detecting infrared (IR) and visible radiation. The material integrates a heavily-to-degenerately doped single-crystalline semiconductor membrane that serves as an optically transparent shield of RF waves and a 2D material that serves as a photoconductive detector of IR and/or visible light. Alternatively, a 2D materials/semiconductor photodiode may detect visible and/or IR radiation.

Figure 1A:
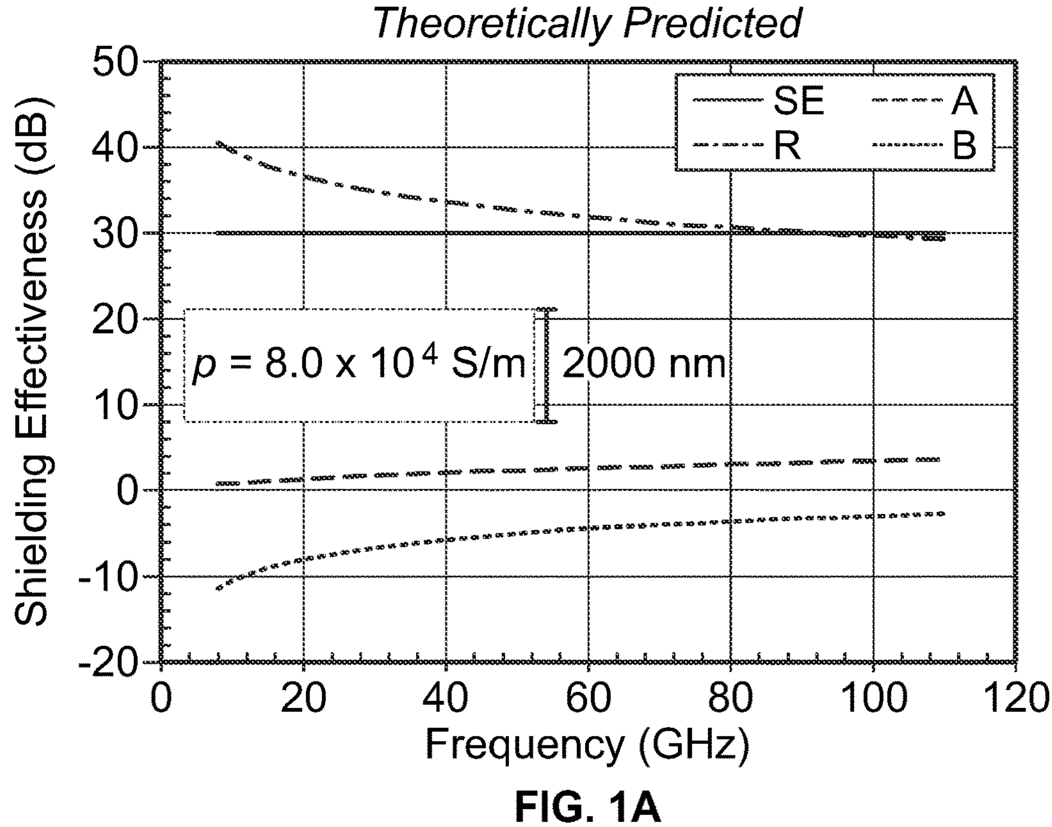
FIGS. 1A, 1B, 1C and 1D depict shielding effectiveness versus frequency for two different types of shields. First, a single-layer shield consisting of a 2 m thick membrane with uniform conductivity where
Figure 1B:
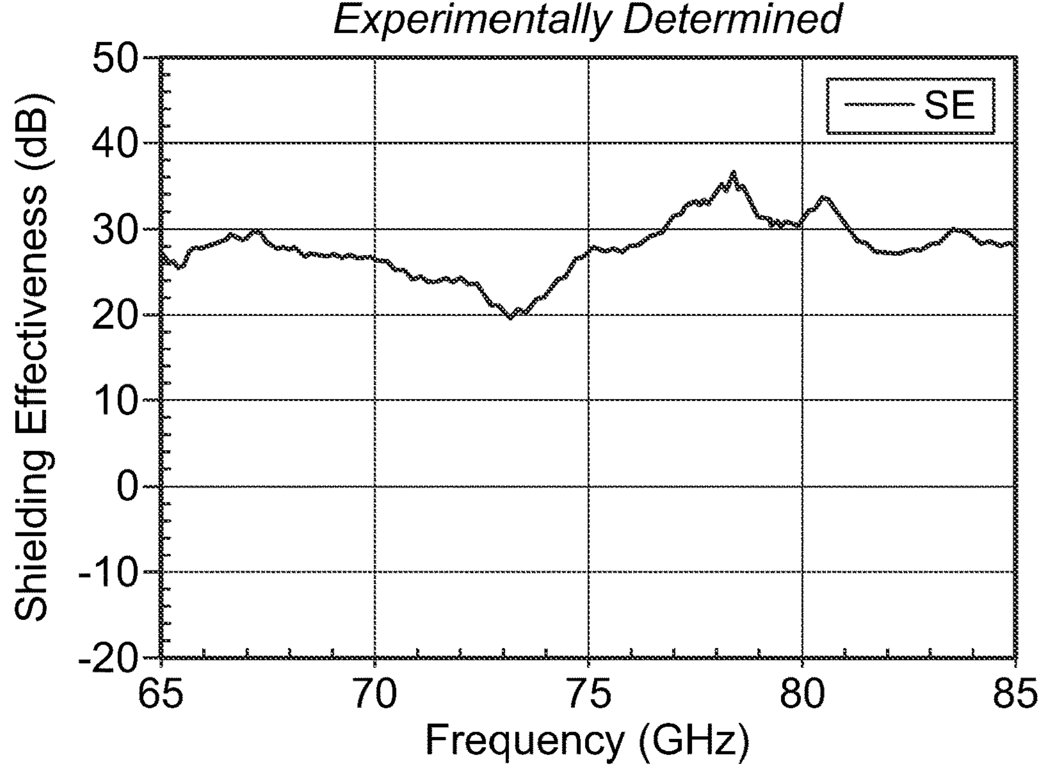
Figure 1C:
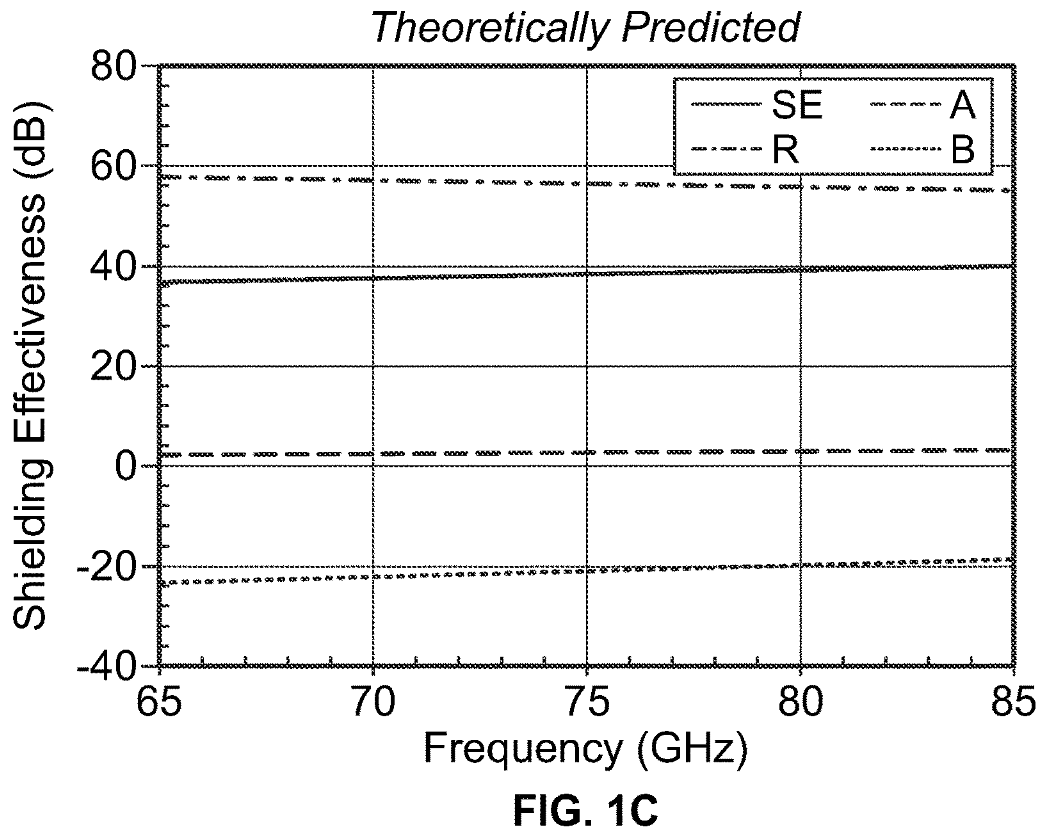
Figure 1D:
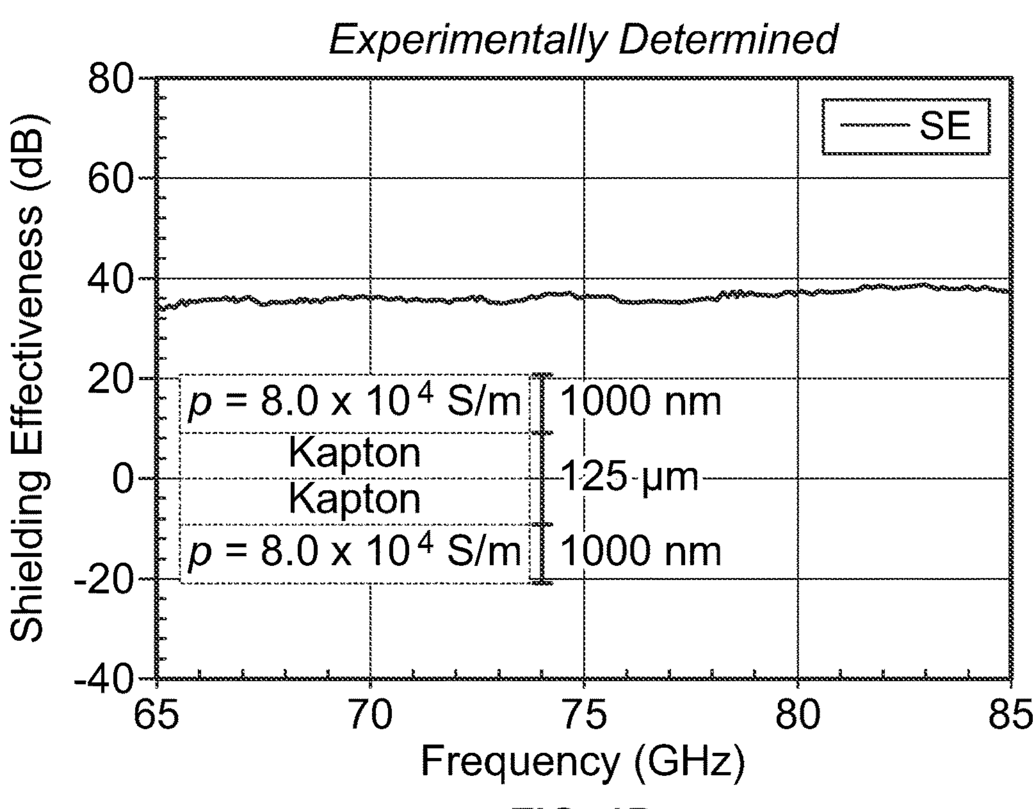

High electromagnetic interference (EMI) shielding effectiveness (SE) can be achieved by controlling the conductivity of semiconductor membranes. Membranes with uniform and non-uniform conductivity across their thickness may serve as EMI shields. In a preferred embodiment, the membranes may be heavily-to-degenerately doped. Also, EMI shields may consist of multiple membranes or layers that may be of the same material or of different materials, with same or different thicknesses and conductivities. FIGS. 1A-B show the theoretically predicted and experimentally determined SE for a single-layer shield consisting of a GaAs semiconductor membrane with uniform doping. FIGS. 1C-D show the theoretically predicted and experimentally determined SE for a multi-layer shield consisting of two GaAs membranes of the same thickness and conductivities with a dielectric (Kapton) in the middle.

Figure 2A:
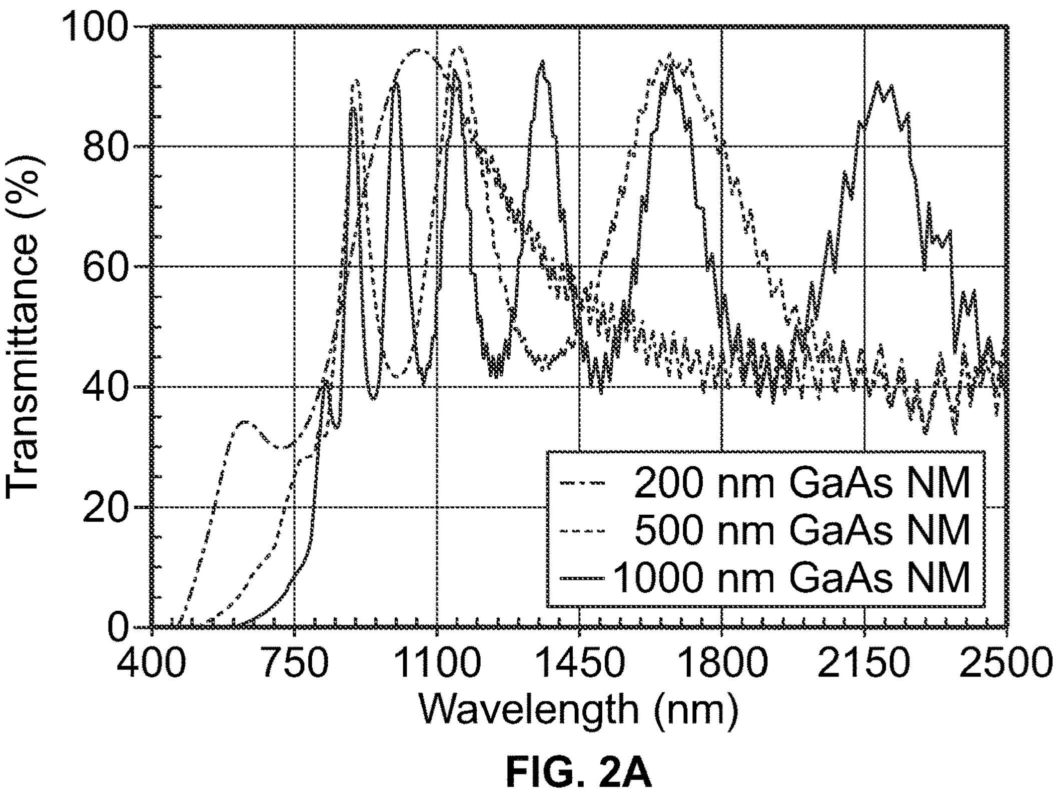
FIGS. 2A and 2B show the optical transparency of heavily doped GaAs membranes from the visible to the near-infrared region of the electromagnetic spectrum.
Figure 2B:
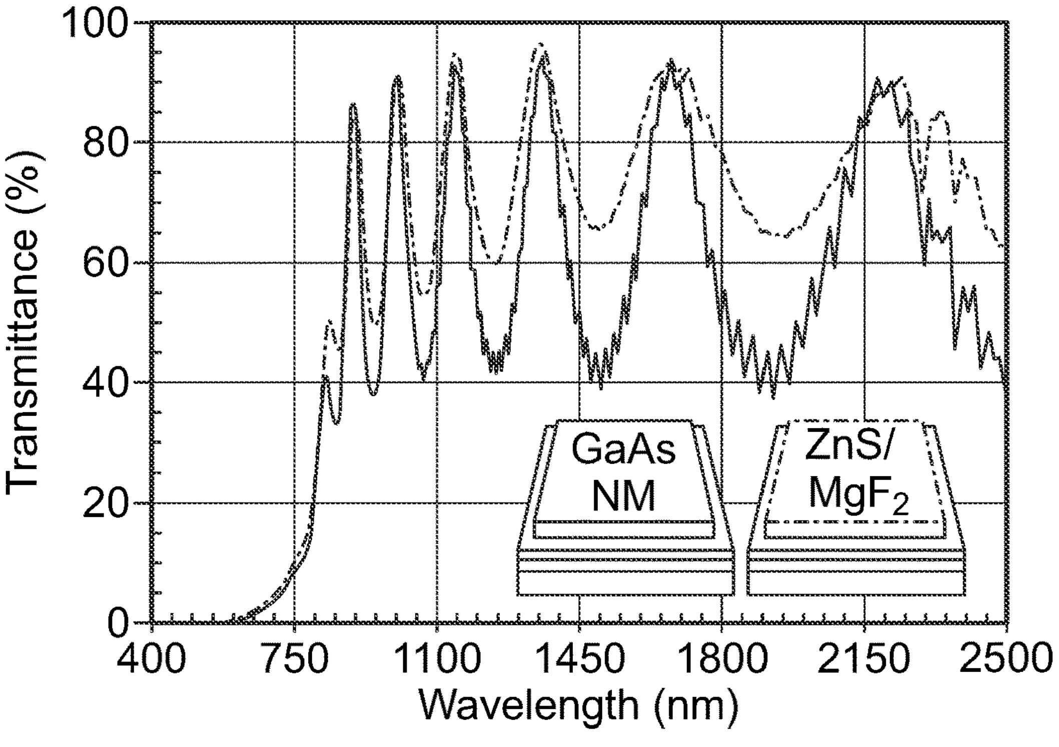

Optical transparency of visible light can be achieved by controlling the thickness of the semiconductor membrane as shown in FIG. 2A. GaAs and Si are inherently transparent to IR radiation. However, reflection must be minimized by the use of anti-reflecting coatings. FIG. 2B shows how ZnS/$MgF_2$ anti-reflecting coating can improve the transmittance of a GaAs membrane.

Figure 3:
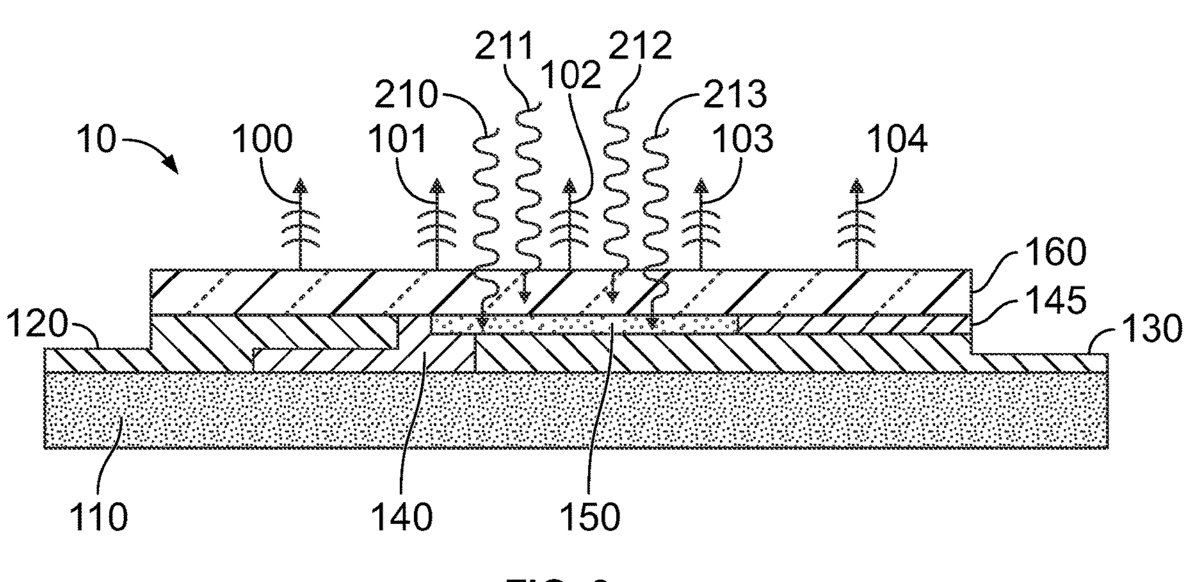
FIG. 3 is a cross-sectional schematic view of a photodiode detector with integrated EMI shield in accordance with the embodiments of the present invention.

As shown in FIG. 3, an embodiment of the presentation provides a nanosheet or layered material which may comprise a photodetector with an integrated EMI shield device 10. Device 10 provides an ultra-thin multi-functional material that blocks incident waves at radio frequencies (RF) 100-104 while detecting infrared and visible radiation 210-213. The material integrates a heavily-to-degenerately doped single-crystalline semiconductor membrane 160 that serves as a flexible and visible-to-IR transparent shield of RF waves and a 2D material 150 that serves as a photodiode detector of infrared (IR) and/or visible light.

Subsequent layers include top electrode 120 and bottom electrode 130, dielectric 140 and 145, a crystalline two-dimensional (2D) semiconductor material 150 which may be black phosphorus, one or more semiconductor membranes 160 such as Si or GaAs, and a flexible substrate 110 which may be a Kapton film. 2D materials 150 may serve as a photodiode detector of infrared (IR) and/or visible light. Alternatively, a 2D materials-semiconductor membrane-based photodiode may detect visible and/or IR radiation.

High electromagnetic interference shielding effectiveness can be achieved by controlling conductivity of semiconductor membranes 160. Optical transparency of the visible light can be achieved by controlling the thickness of the semiconductor membrane 160. GaAs and Si are inherently transparent to IR radiation. However, reflection should be minimized.

Figure 4A:
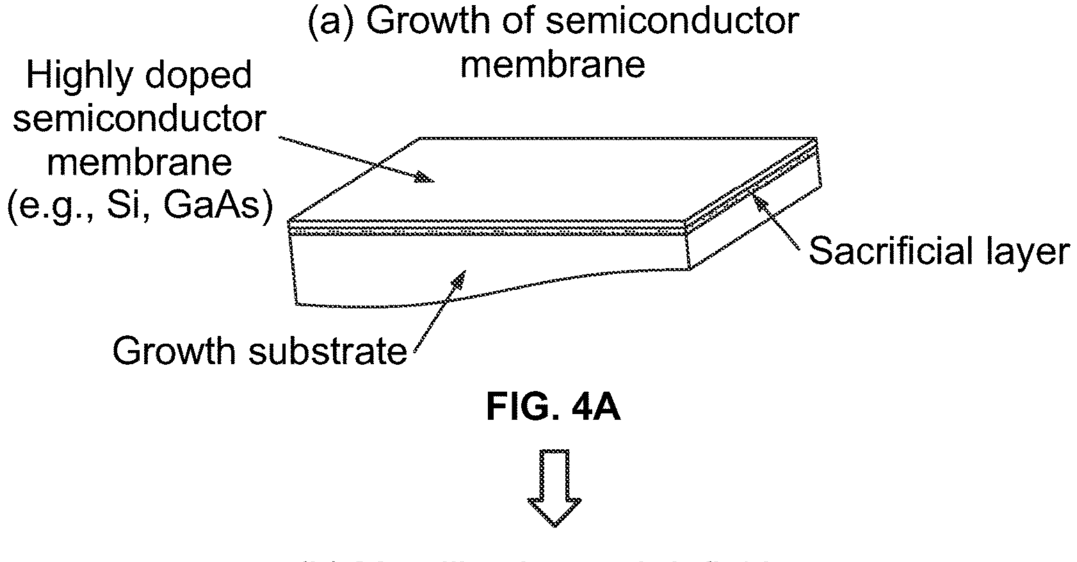
Figure 4B:
Figure 4B:
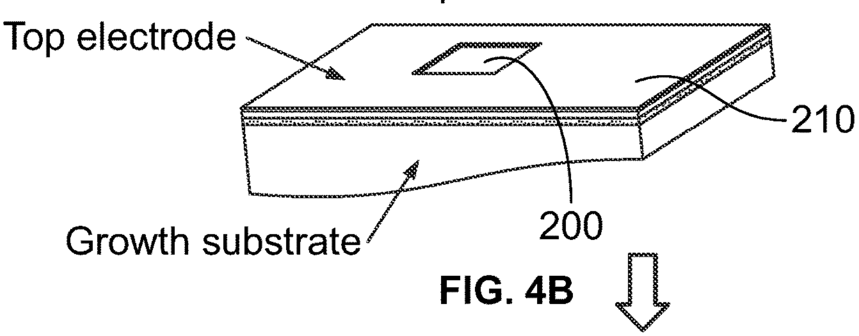
Figure 4C:
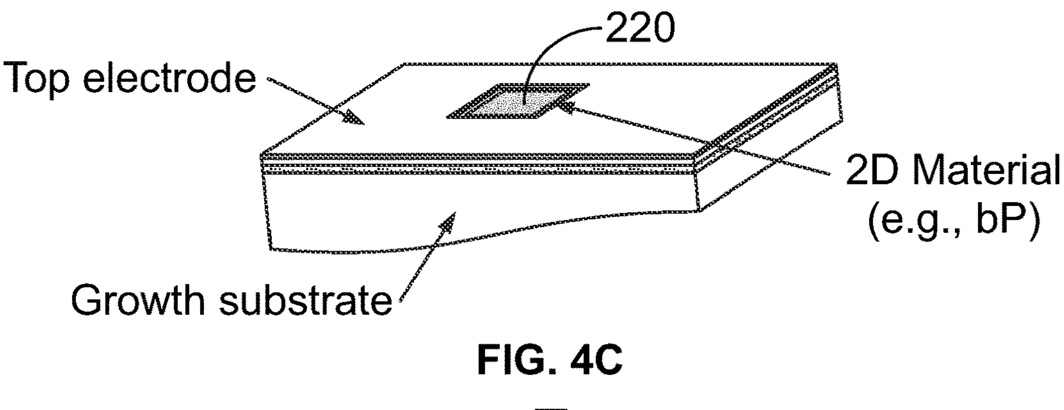

FIGS. 4A-4H illustrate steps of a fabrication process to integrate EMI shielding and IR detector functionalities in a nanosheet. FIG. 4A shows the growth structure of the semiconductor membrane consisting of the growth substrate, the sacrificial layer that will allow the release of the highly doped semiconductor membrane on top. FIG. 4B shows the metallization and definition of top electrode 210 with a window or opening 200 where the 2D material will be placed. Next, as shown in FIG. 4C, 2D material 220 (e.g., bP) is dry- or wet-transferred onto the exposed surface of the semiconductor membrane created by window or opening 200. The order of the previous two steps can be switched, i.e., the 2D material can be transferred onto the semiconductor membrane before the patterned electrode is created.

Figure 4D:
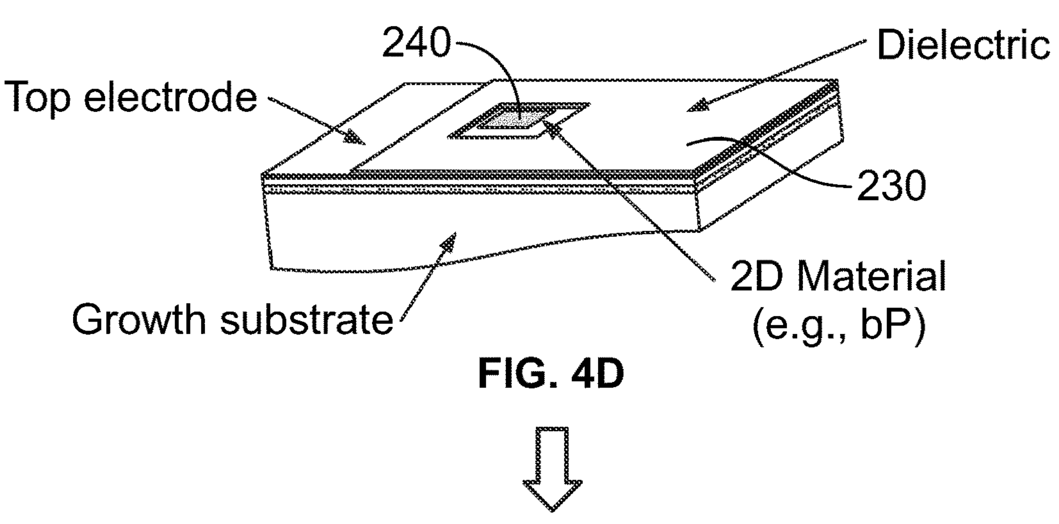

As shown in FIG. 4D, a dielectric coating 230, is then deposited to isolate the top and bottom electrodes of the device, and a window or opening 240 is patterned in the dielectric using conventional top-down processing techniques. Window or opening 240, in a preferred embodiment, aligns with and matches the dimensions of window 200 to make electrical contact with 2D material 220. In another embodiment, the window may be aligned with the 2D material and need not dimensionally match to establish electrical contact.

Figure 4E:
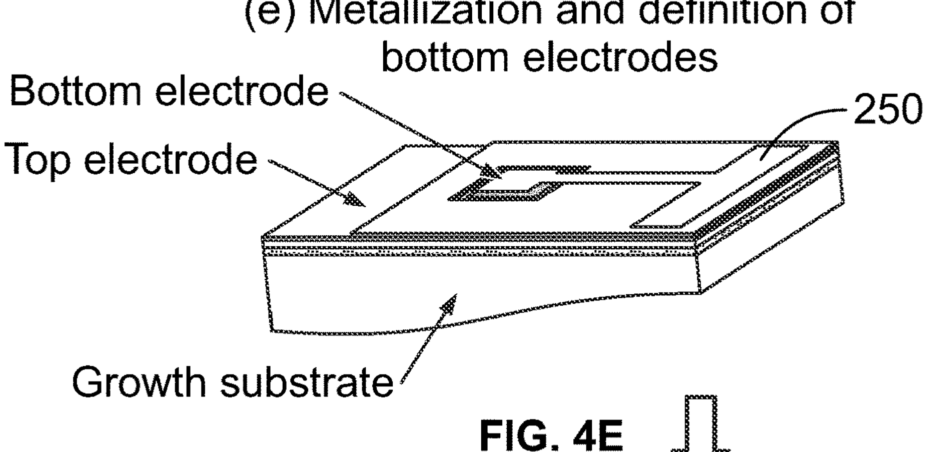
Figure 4F:
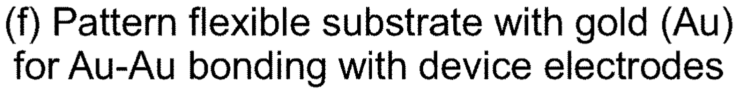
Figure 4F:
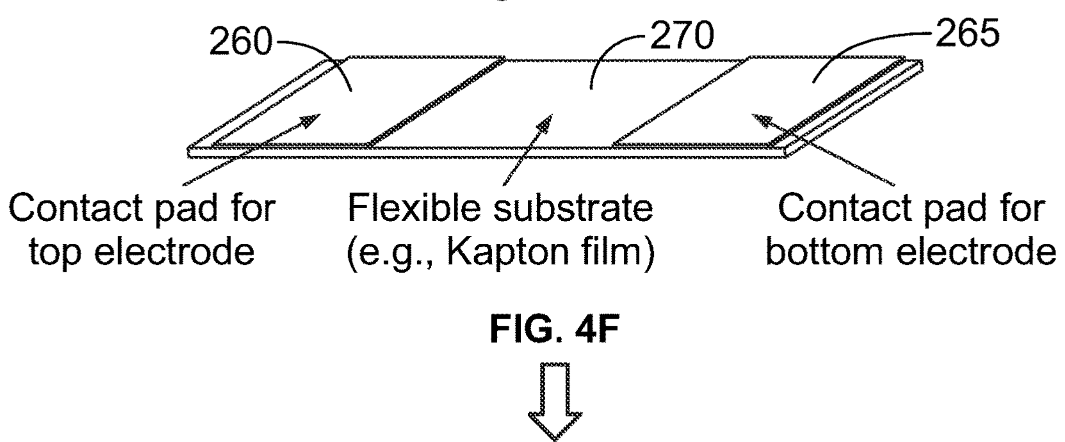
Figure 4G:
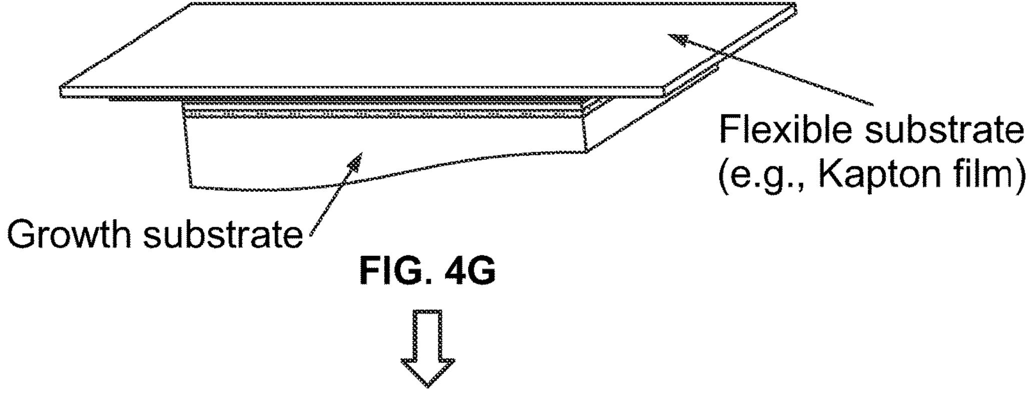
Figure 4H:
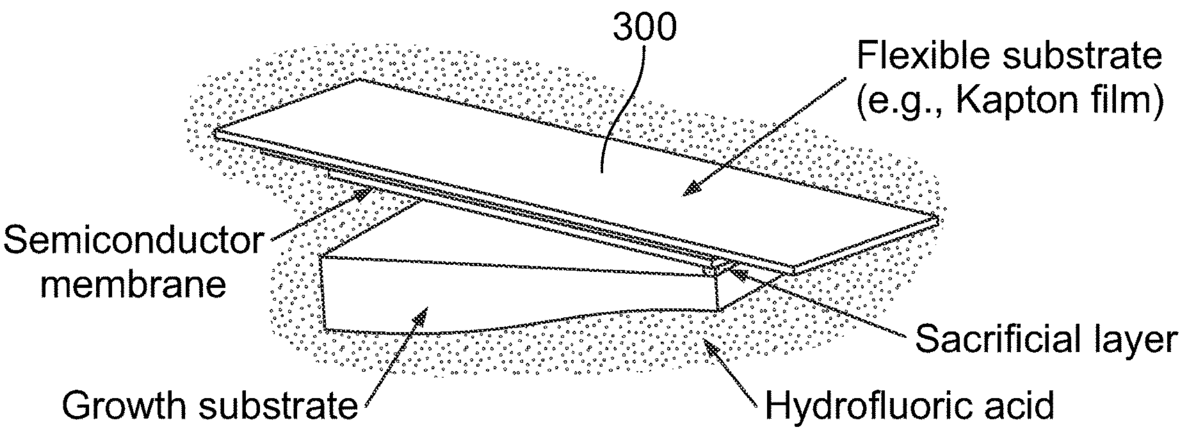

As shown in FIG. 4E, bottom electrode 250 of the photodiode is created by photolithography, metal evaporation, and lift-off. As shown in FIG. 4F, contact pads 260 and 265 are patterned on the receiving flexible substrate 270 to promote bonding and increase the available area for electrical connections to external electronic circuits. The metal (s) forming the top surface of the photodiode electrodes are used for the large-area contact pads on the flexible substrate. As shown in FIG. 4G, flexible substrate 270 is then bonded to the multi-functional material. As shown in FIG. 4H, multi-functional material/new substrate combination 300 is released by selective wet or dry etching of the sacrificial layer. Alternatively, multi-functional/flexible material 300 is isolated by wet etching of the sacrificial layer and transferred to deionized water. The flexible substrate is then adhered to the multi-functional material floating on the surface of DI water.

Another method to integrate EMI shielding and IR detector functionalities in a nanosheet for a 2D material/semiconductor photodiode comprises the steps of: (1) dry- or wet-transferring the 2D material (e.g., bP) onto the surface of the semiconductor membrane; (2) depositing a dielectric coating to isolate the top and bottom electrodes of the device and also to prevent degradation of 2D material; (3) Patterning a window in the dielectric using top-down processing techniques to access the semiconductor membrane where the top electrode will be; (4) Depositing metals for top electrode; (5) Patterning a window in the dielectric to access the 2D material and make electrical contacts; (6) creating the bottom electrode of the photodiode by photolithography, metal evaporation, and lift-off; (7) patterning contact pads on the receiving flexible substrate to promote bonding and increase the available area for electrical connections to external electronic circuits; (8) bonding a flexible substrate to the multi-functional material; (10) releasing the multi-functional material/new substrate combination by (a) selective wet or dry etching of the sacrificial layer or (b) by wet etching of the sacrificial layer and transferred to deionized water; and (11) adhering the flexible substrate to the multi-functional material floating on the surface of DI water.

In another embodiment, the present invention concerns a layered material comprising: a flexible substrate which may be a Kapton film; subsequent layers include two electrodes, a dielectric, a two-dimensional material, and one or more semiconductor membranes. The semiconductor membranes block incident waves at radio frequencies (RF) while detecting infrared and visible radiation.

In another embodiment, the layered material comprises a uniformly and degenerately doped single-crystalline semiconductor membrane with a thickness ranging from 1 to 3 μm that serves as an IR transparent shield of RF waves with frequencies ranging between the X and the W band of the electromagnetic spectrum. Also, the layered material may integrate a single-crystalline semiconductor membrane with non-uniform doping across its thickness that serves as an optically transparent shield of RF waves with frequencies ranging between the X and the W band of the electromagnetic spectrum.

In yet another embodiment, the present invention concerns a semiconductor membrane having a thickness ranging between 100 and 300 nm and comprises one or two degenerately doped regions at the surface boundary of the membrane. In another embodiment, the entire membrane may be doped.

Figure 5:
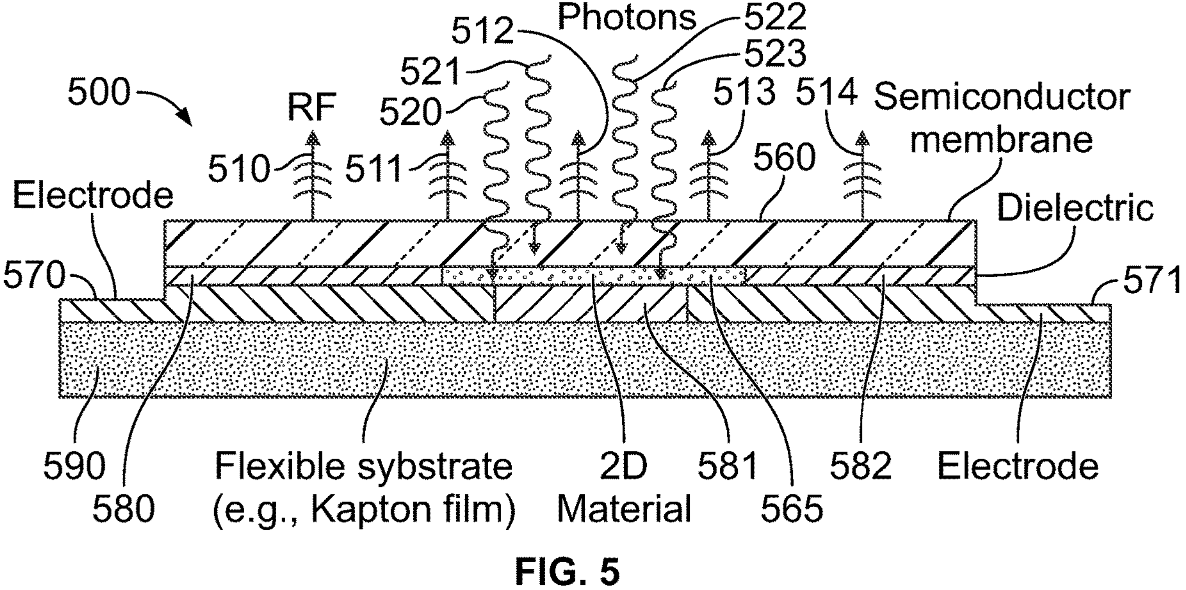
FIG. 5 depicts a cross-sectional schematic view of a photoconductive detector with integrated EMI shield in accordance with the embodiments of the present invention.

As shown in FIG. 5, an embodiment of the presentation provides a nanosheet or layered material which may comprise a photoconductive detector with an integrated EMI shield 500 that blocks incident waves at radio frequencies (RF) 510-514 while detecting infrared and visible radiation 520-523. The material integrates a heavily-to-degenerately doped single-crystalline semiconductor membrane 560 that serves as a flexible and visible-to-IR transparent shield of RF waves and a 2D material 565 that serves as a photoconductive detector of infrared (IR) and/or visible light.

Subsequent layers include electrodes 570 and 571. Crystalline two-dimensional (2D) semiconductor material 565 may be black phosphorus. Also included are dielectric sections 580-582 a flexible substrate 590 which may be a Kapton film. Another method to integrate EMI shielding and IR detector functionalities in a nanosheet is to have 2D material photoconductor integrated with a semiconductor membrane EMI shield comprises the steps of; (1) dry- or wet-transferring a 2D material onto the surface of a semiconductor membrane; (2) coating said semiconductor membrane and said 2D material with a dielectric material; (3) patterning two stripe on said dielectric to access the edges of the said 2D material by photolithography and wet or dry etching; (4) Pattern electrodes on 2D material/dielectric surface by photolithography, metal evaporation, and lift-off; (5) patterning contact pads on a receiving flexible substrate to promote bonding and increase the available area for electrical connections to external electronic circuits; (6) Deposit dielectric in between contact pads on said flexible substrate to achieve a flat surface; (7) bonding a flexible substrate to the multi-functional material; (10) releasing the multi-functional material/new substrate combination by (a) selective wet or dry etching of the sacrificial layer or (b) by wet etching of the sacrificial layer and transferred to deionized water; and (11) adhering the flexible substrate to the multi-functional material floating on the surface of DI water.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A method to integrate EMI shielding and visible-to-IR detector functionalities in a semiconductor/2D material photodiode comprising the steps of: (1) coating a semiconductor membrane with a metal film that will serve as the top electrode; (2) patterning a window in said top electrode to expose semiconductor membrane; (3) dry- or wet-transferring 2D material onto the exposed surface of the semiconductor membrane; (4) depositing a dielectric coating to isolate the top and bottom electrodes of the device; (5) patterning a window in the dielectric using top-down processing techniques to allow electrical contact to said 2D material; (6) creating the bottom electrode of the photodiode by photolithography, metal evaporation, and lift-off; (7) patterning contact pads on the receiving flexible substrate to promote bonding and increase the available area for electrical connections to external electronic circuits; (8) bonding a flexible substrate to the multi-functional material; (10) releasing the multi-functional material/new substrate combination by (a) selective wet or dry etching of the sacrificial layer or (b) by wet etching of the sacrificial layer and transferred to deionized water; and (11) adhering the flexible substrate to the multi-functional material floating on the surface of DI water.

2. The method of claim 1 wherein said window in said electrode aligns with and matches the dimensions of said window in said dielectric.

3. The method of claim 1 wherein said 2D material is black phosphorus.

4. A method to integrate EMI shielding and IR detector functionalities in a nanosheet for a semiconductor/2D material photodiode comprising the steps of: (1) dry- or wet-transferring the 2D material (e.g., bP) onto the surface of the semiconductor membrane; (2) depositing a dielectric coating to isolate the top and bottom electrodes of the device and also to prevent degradation of 2D material; (3) Patterning a window in the dielectric using top-down processing techniques to access the semiconductor membrane where the top electrode will be; (4) Depositing metals for top electrode; (5) Patterning a window in the dielectric to access the 2D material and make electrical contacts; (6) creating the bottom electrode of the photodiode by photolithography, metal evaporation, and lift-off; (7) patterning contact pads on the receiving flexible substrate to promote bonding and increase the available area for electrical connections to external electronic circuits; (8) bonding a flexible substrate to the multi-functional material; (10) releasing the multi-functional material/new substrate combination by (a) selective wet or dry etching of the sacrificial layer or (b) by wet etching of the sacrificial layer and transferred to deionized water; and (11) adhering the flexible substrate to the multi-functional material floating on the surface of DI water.

5. The method of claim 4 wherein said window in said electrode aligns with and matches the dimensions of said window in said dielectric.

6. The method of claim 4 wherein said 2D material is black phosphorus.

7. A method to integrate EMI shielding and IR detector functionalities in a nanosheet for a semiconductor photoconductive detector comprising the steps of: (1) dry- or wet-transferring a 2D material onto the surface of a semiconductor membrane; (2) coating said semiconductor membrane and said 2D material with a dielectric material; (3) patterning two stripes on said dielectric to access the edges of the said 2D material by photolithography and wet or dry etching; (4) Pattern electrodes on 2D material/dielectric surface by photolithography, metal evaporation, and lift-off; (5) patterning contact pads on a receiving flexible substrate to promote bonding and increase the available area for electrical connections to external electronic circuits; (6) Deposit dielectric in between contact pads on said flexible substrate to achieve a flat surface; (7) bonding a flexible substrate to the multi-functional material; (10) releasing the multi-functional material/new substrate combination by (a) selective wet or dry etching of the sacrificial layer or (b) by wet etching of the sacrificial layer and transferred to deionized water; and (11) adhering the flexible substrate to the multi-functional material floating on the surface of DI water.

* * * * *